United States Patent [19]

Yuen

[11] Patent Number: 4,751,404
[45] Date of Patent: Jun. 14, 1988

[54] MULTI-LEVEL ECL SERIES GATING WITH TEMPERATURE-STABILIZED SOURCE CURRENT

[75] Inventor: Raymond C. Yuen, San Diego, Calif.

[73] Assignee: Applied Micro Circuits Corporation, San Diego, Calif.

[21] Appl. No.: 926,378

[22] Filed: Oct. 31, 1986

[51] Int. Cl.$^4$ .......................... H03K 3/01; H03K 3/26; H03K 19/086
[52] U.S. Cl. ..................................... 307/297; 307/310; 307/455; 323/907
[58] Field of Search ............... 307/297, 310, 455, 467, 307/296.6; 323/311, 312, 907

[56] References Cited

U.S. PATENT DOCUMENTS

| | | | |
|---|---|---|---|
| 4,150,309 | 4/1979 | Tokuda | 307/310 |
| 4,585,957 | 4/1986 | Ooms | 307/455 |
| 4,628,248 | 12/1986 | Birrittella et al. | 323/907 |
| 4,639,661 | 1/1987 | Williams et al. | 307/455 |
| 4,644,249 | 2/1987 | Chang | 323/907 |

Primary Examiner—Stanley D. Miller
Assistant Examiner—B. P. Davis
Attorney, Agent, or Firm—Brown, Martin, Haller & Meador

[57] ABSTRACT

In a multi-level ECL series gating circuit with three levels of gating which operates over specified operating circuit voltage and operating circuit temperature ranges, provision is made for stabilizing the magnitude of the circuit source current over the operating voltage and temperature ranges by regulating the bias voltage which determines the circuit source current. The bias voltage is regulated according to the inverse of the operating temperature to account for the temperature characteristics of the base-to-emitter diode in the transistor generating the circuit current. The magnitude of the bias voltage over the temperature range never reaches a level which will send the circuit current transistor into saturation at any circuit voltage in the operating range.

6 Claims, 3 Drawing Sheets

FIG. I PRIOR ART

MULTI-LEVEL ECL SERIES GATING WITH TEMPERATURE-STABILIZED SOURCE CURRENT

BACKGROUND OF THE INVENTION

The invention is in the field of multi-level ECL circuitry in which plural gating levels are connected in series between a circuit voltage node and a circuit current source. More particularly, the invention concerns the stabilization of the circuit current magnitude by the regulation of a bias voltage which is fed to the transistor which generates the circuit current.

Both the field of the invention and the limitations of the state of the art in the invention field can be understood with reference to FIG. 1, which is representative of a multi-level ECL gating circuit. The circuit of FIG. 1 is intended to be connected in series with other multi-level gating circuits to implement desired logic functions. The multi-level gating circuit of FIG. 1 includes three gating levels, each responsive to a respective one of three input signals A, B, or C. The first level, responsive to input A, consists of eight transistors, $Q_1$–$Q_8$, which are connected into four emitter-coupled pairs. In this regard, the transistor pair $Q_1$ and $Q_2$ are said to be emitter-coupled by virtue of their emitters being connected directly together and their collectors being connected through respective resistors to a common voltage node, in this case, the circuit voltage source node Vcc. A stabilized bias voltage $VT_2$ is connected to the base of $Q_2$, while the base of $Q_1$ receives the input logic signal A. Thus connected, the emitter-coupled pair $Q_1$ and $Q_2$ will switch a circuit current according to the magnitude of the signal A with respect to the bias level $VT_2$. When A exceeds the bias voltage level, $Q_1$ will be switched on to conduct the circuit current through $R_1$. When the magnitude of A is less than the level of the threshold voltage at the base of $Q_2$, the current is switched through $Q_2$. Thus, the emitter-coupled pair $Q_1$ and $Q_2$ form a basic binary circuit which assumes one of two states according to the state of the input signal A.

The first level of the circuit of FIG. 1 includes the four emitter-coupled pairs, $Q_1Q_2$, $Q_3Q_4$, $Q_5Q_6$, and $Q_7Q_8$, each of which operates binarily in response to the signal level at the node A. The second gating level responds to the signal at the signal node B, and consists of the two emitter-coupled transistor pairs $Q_{10}Q_{11}$ and $Q_{12}Q_{13}$. Each transistor of each second gating level pair is connected in emitter-coupled form, with the collector of each transistor of the pair connected to the coupled emitters of a respective one of the first level transistor pairs. Thus, the collector of the transistor $Q_{10}$ in the pair $Q_{10}Q_{11}$ is connected to the commonly-coupled emitters of the pair $Q_1 Q_2$ in the first gating level. Each of the emitter-coupled transistor pairs in the second gating level switches in response to the signal magnitude on the node B against the threshold voltage $VT_3$. Finally, the FIG. 1 prior art circuit includes a third gating level having a single emitter-coupled transistor pair $Q_{20} Q_{21}$. The emitter-coupled node of the third gating level pair is connected to the collector of a circuit current source transistor $Q_{30}$. The current source transistor $Q_{30}$ is connected between the emitter node of the third gating level transistor pair and the circuit ground node.

The prior art circuit of FIG. 1 can provide one or more outputs, each corresponding to a respective combination of the three inputs A, B, and C. For this example, the output Y is taken between the collector of $Q_2$ and the resistor $R_1$ in the first gating level of the circuit. This output corresponds to a Boolean expression $Y=f(A, B, C)$. Relatedly, the magnitude of Y assumes one of two levels. The output, Y, is conventionally provided by the FIG. 1 circuit through the emitter follower $Q_{40}$. This configuration provides the very desirable feature of resistance transformation over a broad frequency range. In practice, the gating level input nodes A, B, and C receive signals having voltage characteristics similar to the Y output. Typically, the voltage swing for each output is 500 mV; for each gating level, the voltage swing is centered around the VT value for the gating level. Therefore, the resistor $R_1$ is selected such that the Y output has a swing of $Vcc-VBE_{Q40}$ to $Vcc-VBE_{Q41}-0.5Vdc$. The first level gating threshold, $VT_2$, therefore is $Vcc-VBE-0.25Vdc$. The second level threshold voltage, $VT_3$ is a diode voltage drop below $VT_2$, or $Vcc-2VBE-0.25Vdc$. Finally, the third gating level threshold voltage $VT_4$ is $Vcc-3VBE-0.25Vdc$. It will be appreciated that the input circuits for the second and third gating levels are designed to account for the cumulative base-to-emitter voltage drops which determine the respective gating level threshold voltages. Thus, the emitter follower transistor $Q_{9a}$ provides, through its base-to-emitter junction, a VBE voltage drop to account for the VBE voltage drop by which the threshold voltage $VT_3$ exceeds the threshold voltage $VT_2$. Similarly, $Q_{19a}$ and $Q_{19b}$ provide the double VBE drop required to account for the corresponding value in the threshold voltage $VT_4$. The emitters of the input followers $Q_{9a}$ and $Q_{19a}$ $Q_{19b}$ are connected, through a respective resistor to ground. Thus, the emitter resistor for each input follower sets an average current value which varies positively when the input to the input follower rises and negatively when the level falls.

Increasingly, the application specifications for circuits such as are represented by FIG. 1 call for operation in extremely hostile environments. For example, space and military applications commonly require circuit operations over a temperature range of $-55°$ C. to $125°$ C. Further, the systems incorporating these circuits are specified to operate with voltage sources which vary in operation by + or $-10\%$. For example, space and military operational requirements frequently specify that the circuit voltage represented by Vcc will vary from 4.5VDC to 5.5VDC.

These operational ranges impose conditions on the circuit of FIG. 1 which cause its operational characteristics to vary undesirably. The principal cause of such undesirable variation is the prevailing design philosophy which seeks to stabilize certain circuit parameters by limiting the variation range of the circuit voltage Vcc. This voltage is regulated in an attempt to stabilize the magnitude of the circuit current generated by the transistor $Q_{30}$. The thought is that stabilization of Vcc will result in stabilization of the collector voltage of the transistor $Q_{30}$, that is, $V_C$ ($Q_{30}$). Stabilization of the circuit current will result in the input and output characteristics of the FIG. 1 circuit remaining relatively invariant. As is known, the input and output impedance of an emitter follower are determined by the value of emitter current drawn by the follower. Varying the level of emitter follower current will vary the output resistance and capacitance and the input resistance and capacitance of the follower. Since the interconnections between multi-level gating circuits such as that illustrated in FIG. 1 are made through emitter followers such as the output follower $Q_{40}$ and the input follower $Q_{9a}$, it will be appreciated that variation of the currents through those followers will vary the time response of a circuit comprising concatenations of the FIG. 1 circuit. Thus, if, for example, the circuit current generated by the transistor $Q_{30}$ varies, the output characteristics of the output follower $Q_{40}$ will vary as a result. Similarly, if the current provided by the transistor $Q_{30}$ varies, the input characteristics of the input follower $Q_{9a}$ will vary. As is known, over the specified space and military operational ranges, the propagation delay through the circuit of FIG. 1 does vary because of changes in the currents flowing through the gating levels and through the input and output followers of the circuit.

The reason for the variation in input and output characteristics of the FIG. 1 circuit is found in the current generator $Q_{30}$ the output follower $Q_{40}$.

The reason for this variation can be understood with reference to the circuit current source transistor $Q_{30}$. The transistor $Q_{30}$ consists of a collector 10, an emitter 11, a base 12, and an emitter node 13 which is connected through a resistor 14 to ground. As is known, the magnitude of the circuit current which flows through the three levels of gating is established by the voltage drop across the resistor 14. If this voltage varies, the voltage drop across, and therefore, the current through the resistor 14, will vary. In the prior art circuit, $V_{CS}$ is invariant over the temperature range. However, as is known, the base-to-emitter drop between the base 12 and emitter 11 of the transistor $Q_{30}$ does exhibit a temperature sensitivity which is usually expressed in the form of a negative temperature dependence curve. In this regard, the base-to-emitter voltage increases as the ambient temperature decreases. In the silicon technology currently utilized in the production of IC circuits, the temperature dependence has a value of approximately 1.5 mV/°C. Customarily, the variation is calculated as a deviation from the base-to-emitter voltage VBE measured at 25° C. In current silicon IC technology, VBE is characteristically 0.8Vdc. Manifestly then, as the ambient temperature of the transistor $Q_{30}$ varies, the base-to-emitter voltage will vary. The voltage magnitude at the node 13 is $V_{CS}-VBE_{(Q30)}$; therefore, as temperature varies, the node voltage varies, thereby altering the value of the circuit current.

Assuming now that the ambient temperature of the FIG. 1 circuit varies negatively, and that $V_{CS}$ remains stable, one can see that the voltage at the node 13 will drop as a result of an increase in the base-to-emitter voltage of the transistor $Q_{30}$, thereby reducing the magnitude of the circuit current. With the decrease in the circuit current, the voltage drop across $R_1$ will decrease, thereby reducing the voltage swing in Y. Reduction in the voltage swing of Y will reduce the noise margin of the output signal, thereby increasing the susceptibility of the following stage to noise. Further, variation of the output current flowing through the follower $Q_{40}$ varies the output resistance of the follower $Q_{40}$, thereby varying the response time of the FIG. 1 circuit and its following stage. Finally, variation of the currents flowing in the input followers $Q_{9a}$ and $Q_{19a}Q_{19b}$ alters the input characteristics at the B and C terminals.

The principal reason for stabilizing the current generator bias voltage $V_{CS}$ is to avoid the possibility of saturating the circuit current source transistor $Q_{30}$. The concern is that providing a negative temperature characteristic to $V_{CS}$ will raise the level of this voltage in response to a reduction in ambient temperature to a point where the base-to-collector diode of the transistor $Q_{30}$ becomes forward biased, thereby saturating the transistor $Q_{30}$. To date, this concern over saturation has resulted in the stabilization of $V_{CS}$ and the attempt to stabilize input, output, and circuit currents by regulation of Vcc. Additionally, the operating ranges of the FIG. 1 circuit are derated in order to avoid saturation of $Q_{30}$. Since the principal threat of saturation arises when the circuit voltage and temperature are simultaneously at the low ends of these ranges, the low ends are raised. For example, the operational specifications for one available multilevel gating circuit are $V_{CS}=1.23$ V varying and Vcc=4.75 V. Without such derating of Vcc, the prior art circuit continues to exhibit changes in propagation delay and noise margin. With derating of Vcc, the circuit is not able to meet the operational voltage and temperature ranges stipulated for military and scientific applications.

SUMMARY OF THE INVENTION

The principal objective of the invention is therefore to provide a multi-level ECL gating circuit with the ability to exhibit stable propagation and noise characteristics in an application environment in which circuit voltage and ambient temperature vary over predetermined operational ranges.

Another objective of this invention is to provide for the stabilization of input, output, and circuit currents in a multi-level ECL gating circuit intended to operate in a variable ambient temperature and in the face of circuit voltage variation.

The invention is based upon the critical observation made by the inventor that $V_{CS}$ can be regulated in a predetermined fashion to account for the change in base-to-emitter voltage of a current source without posing the danger of saturating the circuit current source transistor of a multi-level ECL gating circuit.

The invention therefore resides in a circuit having multiple bistable gating levels which operates over predetermined circuit voltage and temperature ranges, in which the gating levels are connected in series between a first circuit voltage node and a circuit current source connected to a second circuit voltage node, and in which a circuit output is provided through an emitter follower connected at its collector to the first node, and at its base to the gating level connected to the first node. In this circuit, each level includes a binary element responsive to an input signal having substantially the characteristics of the output signal provided through the emitter follower and assumes a state providing a conductive path for the circuit current, such that the state of the output is determined by the respective states of the gating levels. The invention is embodied as an improvement to such a circuit and includes, in combination, a circuit current source including a resistor and a current source transistor having a collector connected to one of the gating levels, an emitter connected through the resistor to the second node, and a base, and further includes a voltage regulator connected to the current source transistor base for providing a bias voltage which maintains a constant voltage drop over the resistor within the limits of the operating circuit voltage and temperature ranges.

One will appreciate that the above-stated objectives and other attendant advantages are achieved by the invention described below and illustrated in the drawings, which are summarized as follows.

DETAILED DESCRIPTION OF THE INVENTION

Figure 1:
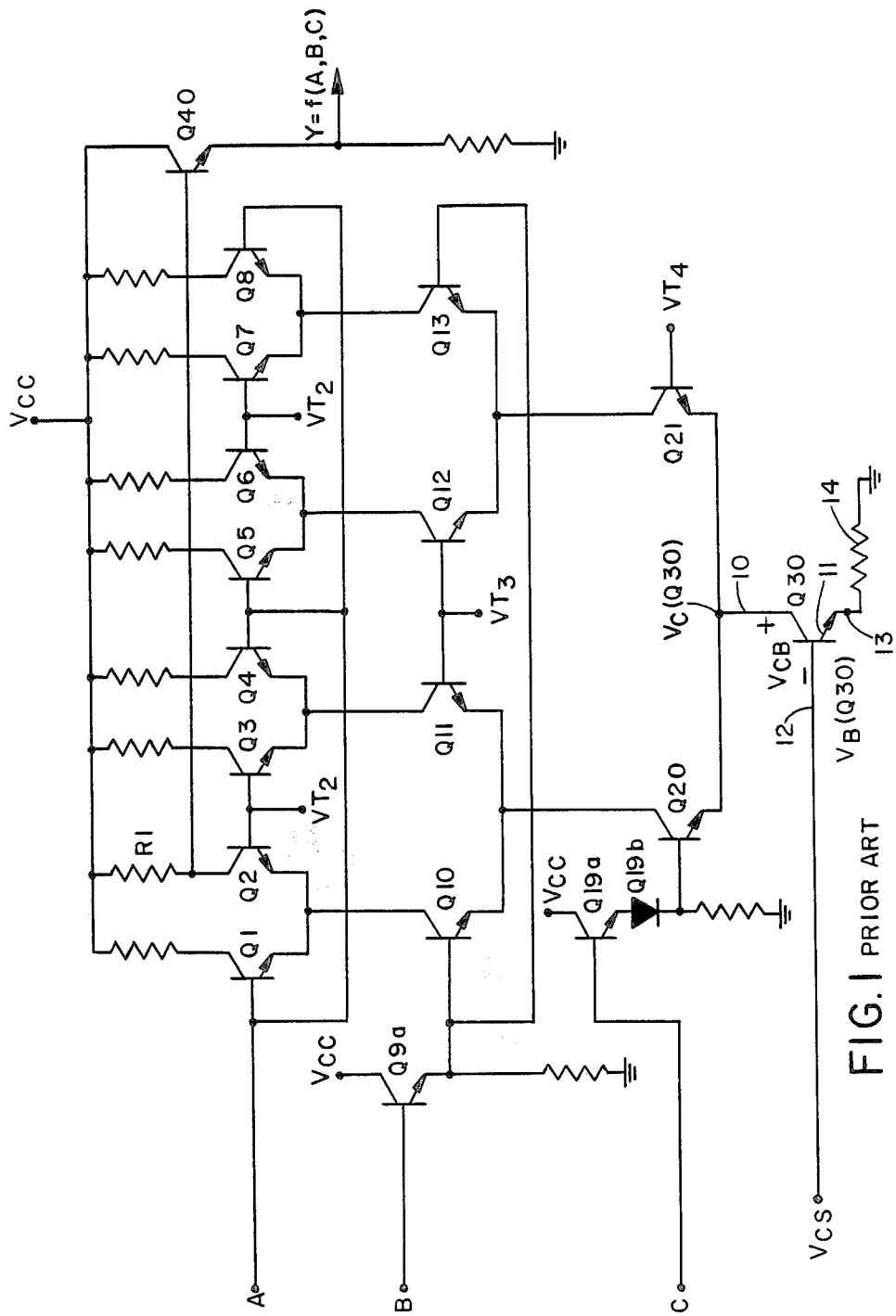
FIG. 1 is a circuit diagram of a prior art multi-level ECL gating circuit with a stabilized current source voltage, $V_{CS}$.
Figure 2:
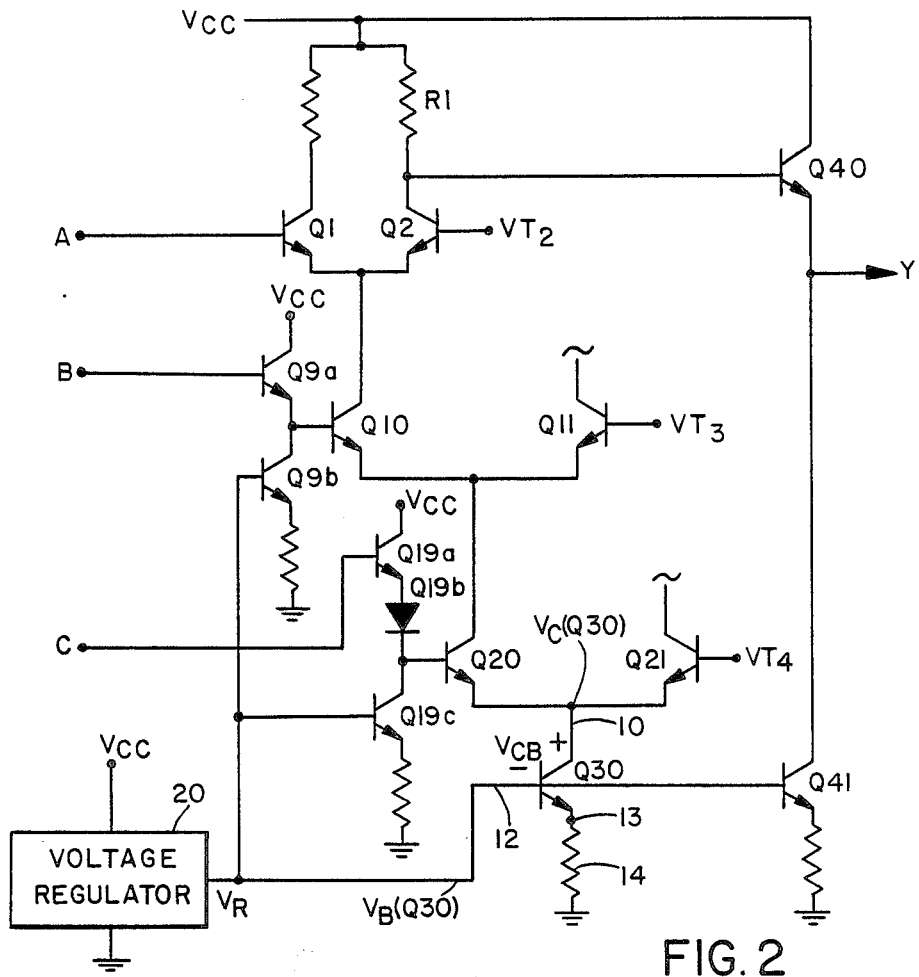
FIG. 2 is a circuit diagram illustrating the invention in which a regulated voltage $V_R$ is provided to the current source transistors of the FIG. 1 circuit.

With reference now to FIG. 2, a portion of the circuit of FIG. 1 is reproduced showing one emitter-coupled transistor pair from each of the gating levels, the input circuits for A, B, and C, the output circuit consisting of the output follower $Q_{40}$, and the circuit current source transistor $Q_{30}$. In the Figure, the input followers $Q_{9a}$ and $Q_{19a}Q_{19b}$ are sourced by constant current sources $Q_{9b}$ and $Q_{19c}$, respectively. The output follower $Q_{40}$ is fed a constant current generated by the current source $Q_{41}$. In addition, there is illustrated a voltage regulator 20 which provides a regulated current bias voltage, $V_R$, connected to the input to the base of each of the current source transistors $Q_{9b}$, $Q_{19c}$, $Q_{30}$, and $Q_{41}$.

Figure 3:
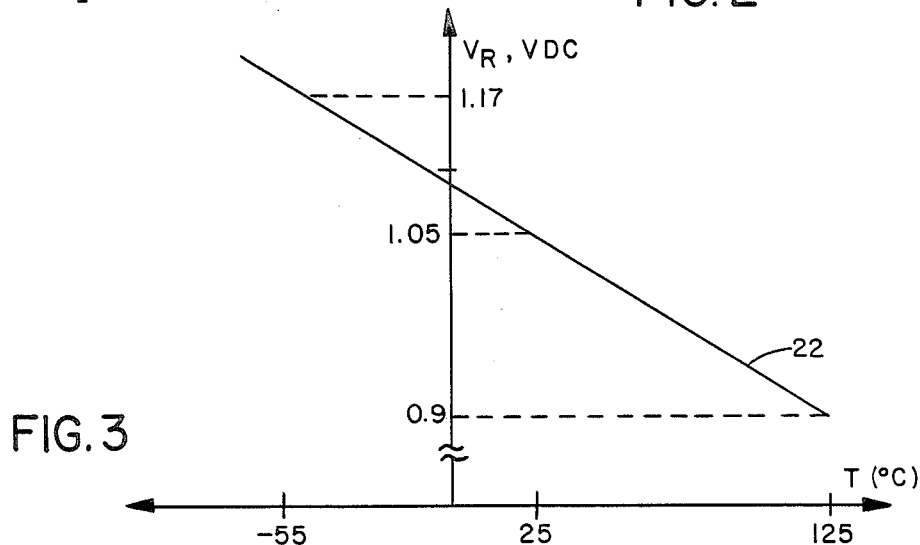
FIG. 3 is a plot illustrating the temperature dependence of $V_R$.

The voltage regulator 20 is essentially conventional and provides the voltage $V_R$ with the characteristic illustrated in FIG. 3. In FIG. 3, $V_R$ is represented by the vertical axis, while ambient temperature, T, is presented in centigrade by the horizontal axis. The operating ambient temperature range for military and space applications is shown between −55° C. and 125° C. and is marked on the horizontal axis, while the regulated output of the voltage regulator 20 is represented by the curve 22. With respect to the average room temperature ambient value of 25° C., the curve 22 has a slope (VBE) of 1.5 mV/°C. for decreasing temperatures, and a slope of −1.5 mV/°C. for increasing temperatures. The effect of the voltage regulator characteristic of FIG. 3 is to track the temperature characteristics of a diode such that the voltage across the current source resistor 14, and also across the resistors in the current sources $Q_{9b}$, $Q_{19c}$, and $Q_{41}$ is constant with respect to temperature and voltage. This is confirmed by the following equations:

$$VE_{(Q30)} = V_R - VBE_{(Q30)} \qquad (1)$$

At −55° C., $$VE = 1.05 + (80 \cdot \Delta VBE) - (VBE + 80 \cdot \Delta VBE) \text{ TM} \quad (2)$$

$$VE = 1.05 - VBE$$

At 125° C., $$VD = 1.05 - (100 \cdot \Delta VBE) - (VBE - 100 \cdot \Delta VBE) \quad (3)$$

$$VD = 1.05 - VBE$$

Thus, VE is, at any voltage and temperature within the specified operating ranges, the difference between the absolute voltage of 1.05 V and VBE of the transistor $Q_{30}$. The absolute voltage of 1.05Vdc is selected to be equal to VBE+250 mV; therefore, as shown in equation (4), the emitter voltage of the transistor $Q_{30}$ is 250 mV, which is one-half of the desired voltage swing of 500 mV for Y. The voltage swing is realized by proper selection of the value of $R_1$. It should be evident that maintaining the 250 mV drop across the resistor 14 over the specified operating voltage and temperature ranges will maintain the desired voltage swing, and therefore, the noise margin of 250 mV in Y.

$$VE = (VBE + 250 \text{ mVdc}) - VBE = 250 \text{ mv} \quad (4)$$

With respect to the concern of saturating $Q_{30}$, the base-to-emitter junctions of $Q_{10}$ and $Q_{20}$ are first considered as being representative of the corresponding junctions in the other transistors of the respective gating levels. Taking $Q_{10}$ first, the highest that the voltage on the base of $Q_{10}$ can go is when $Q_2$ is on (the voltage at A is low). In this case, the voltage at the base of $Q_{10}$ is given as: $VB_{(Q10)} = Vcc - 2VBE$. At this time the voltage on the collector of $Q_{10}$ is given by equations 5–7.

$$\begin{aligned} VC_{(Q10)} &= VT_2 - VBE_{(Q2)} & (5) \\ &= Vcc - VBE - 250 \text{ mV} - VBE & (6) \\ &= Vcc - 2\,VBE - 250 \text{ mV} & (7) \end{aligned}$$

Thus, the voltage between the collector and base of $Q_{10}$ is given by equations (8a) and (8b) as:

$$VCB_{(Q10)} = Vcc - 2VBE - 250 \text{ mV} - Vcc + 2VBE \quad (8a)$$

$$VCB_{(Q10)} = -250 \text{ mV} \quad (8a)$$

Figure 4:
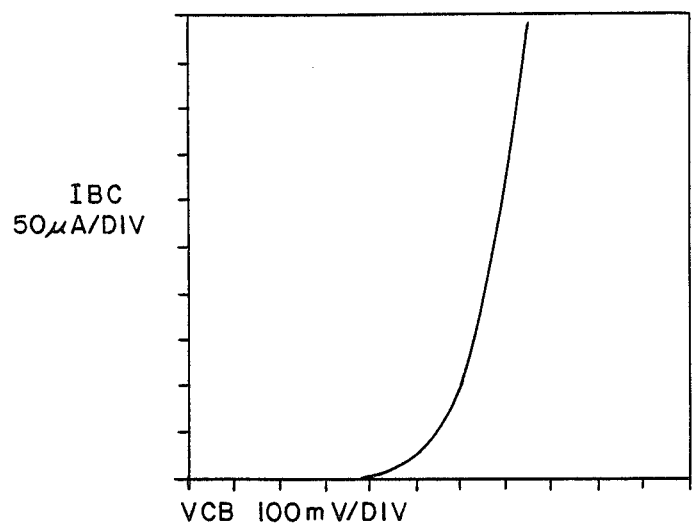
FIG. 4 is a plot illustrating the forward characteristic of the base-to-collector diode of a circuit current source transistor at 150° C.

Thus, the collector-to-base voltage of $Q_{10}$ is independent of VBE and is held constant at 250 mV at all temperatures. Therefore, even though the junction is forward-biased, the level is insufficient to turn on the diode, which keeps the transistor from saturating. This is illustrated in FIG. 4, which illustrates the forward characteristic of the base-to-collector diode of $Q_{10}$; at 150° C., the diode does not begin to conduct until approximately 450 mVdc of forward bias are present. Therefore, the transistor stays out of conduction. A similar analysis will provide the same conclusion for all of the transistors in the second and third gating levels.

The saturation analysis of the circuit current source transistor $Q_{30}$ is given as follows for operation at 0° C. In this case, the highest value for the base voltage of $Q_{30}$ is the value of $V_R$. At 0° C.:

$$V_R = 1.05 \text{ mV} + (1.5 \text{ mV}/°C.)25 \quad (9a)$$

$$V_R = 1.087 \text{Vdc} \quad (9b)$$

The lowest that the voltage on the collector of $Q_{30}$ can go is also a cold temperature. At 0° C., and assuming that VBE is 800 mV, the magnitude of this voltage is given by:

$$\begin{aligned} VC_{(Q30)} &= VT_4 - VBE_{(Q21)} & (10a) \\ &= Vcc - 3\,VBE - 250 \text{ mV} - VBE_{(Q21)} & (10b) \\ &= 4.5 - 4\,VBE - 4(1.5 \times 25) - 250 \text{ mV} & (10c) \\ &= 900 \text{ mV} & (10d) \end{aligned}$$

Therefore, the collector-to-base voltage on $Q_{30}$ at 0° C. can calculated as follows:

$$VCB_{(Q30)} = 900 \text{ mV} - 1.087 \text{ V} \quad (11a)$$
$$= -187 \text{ mV} \quad (11b)$$

Thus, assuming 4.5 volts from the circuit voltage source and 0° C. of ambient temperature, the base-to-collector diode of $Q_{30}$ is forward biased by only 187 mV. This also is insufficient to turn on the diode and send the transistor into saturation.

Finally, for the most extreme conditions, that is, when then ambient temperature is $-55°$ C. and Vcc is as low as 4.5Vdc, the collector-to-base voltage on $Q_{30}$ is calculated according to equations (12a)—(12f) as follows:

$$V_R = 1.05 + 1.5 \text{ mV/°C.} \times 80° \text{ C.} \quad (12a)$$
$$= 1.170 \text{ Vdc} \quad (12b)$$
$$VC_{(Q30)} = Vcc - 4 \text{ } VBE - 250 \text{ mV} \quad$$
$$= 4.5 - 4 \times .08 - 4 \times (1.5 \times 80) - 250 \text{ mV} \quad (12c)$$
$$= 570 \text{ mV} \quad (12d)$$
$$VCB_{(Q30)} = (570 - 1170)\text{mV} \quad (12e)$$
$$= -600 \text{ mV} \quad (12f)$$

Figure 5:
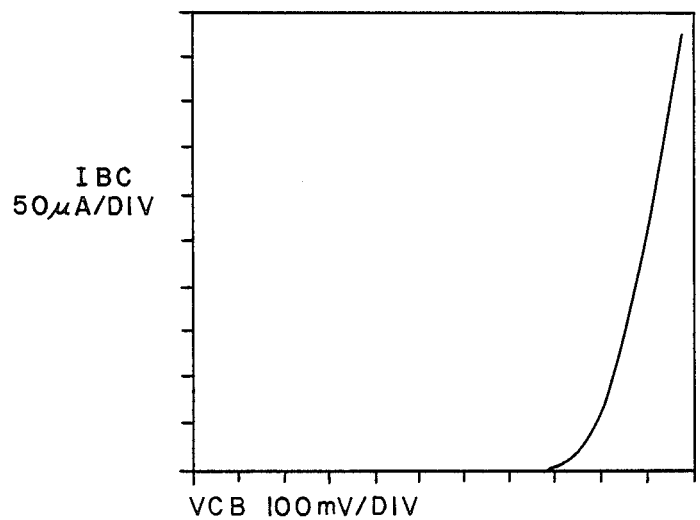
FIG. 5 is a plot illustrating the forward characteristic of the base-to-collector diode at −40° C.

Referring now to FIG. 5, which shows a collector-based diode forward characteristic at $-40°$ C. junction temperature, it can be appreciated that the diode does not turn on until it is forward biased by approximately 860 mVdc. Therefore, adequate margin is still ensured to avoid saturation of $Q_{30}$ at the lowest temperature of the specified operating range. Therefore, saturation of all of the emitter-coupled transistors in all of the gating levels is avoided, as is saturation of the circuit current source transistor $Q_{30}$. Further, constant input current, output current, and circuit current magnitudes are maintained over the specified operating ranges. In sum, the output voltage swing characteristics, noise margins, and propagation delay versus temperature and power supply voltage are stabilized in the circuit of FIG. 2.

Although the invention is described in terms of a multi-level ECL gating arrangement which operates between a positively-valued collector voltage source Vcc and ground, it should be evident to those skilled in the art that the teachings of the invention are applicable also to circuits which operate with different voltage values at the corresponding nodes.

Obviously, many modifications and variations are possible in light of these teachings and, it is therefore understood that the invention may be practiced other than as specifically described herein.

I claim:

1. In a circuit having multiple bistable gating levels which operates over predetermined circuit voltage and temperature ranges, in which the gating levels are connected in series between a first circuit voltage node and a circuit current source connected to a second circuit voltage node and generating a circuit current, and in which a circuit output signal is provided through an output emitter follower connected at its collector to said first circuit voltage node, and at its base to the gating level connected to the first node,
wherein each of said gating levels includes a binary element responsive to an output signal substantially equivalent to said output signal for assuming a state providing a conductive path for the circuit current, the state of said output signal being determined by the states of said gating levels, the improvement comprising, in combination;
said circuit current source including a first resistor and a first current source transistor having a collector connected to one of said gating levels, an emitter connected through said first resistor to said second node, and a base;
an output follower current source for generating said output signal, said output follower current source including a second resistor and a second current source transistor having a collector connected to the emitter of said output emitter follower, an emitter connected through said second resistor to said second node, and a base; and
a voltage regulation means connected to the bases of said first and second current source transistors for providing a bias voltage to said current source transistors which maintains a constant voltage drop over said first and second resistors within the limits of said operating circuit voltage and temperature ranges.

2. The improvement of claim 1 wherein said voltage current regulation means provides said bias voltage with a negative temperature dependence.

3. The improvement of claim 1 wherein said temperature range has a cold limit and a hot limit, relatively higher than said cold limit, and said circuit has three gating levels and the magnitude of the bias voltage at said cold limit prevents said first current source transistor from saturating when said circuit voltage is at its lowest limit.

4. The improvement of claim 3 wherein said cold limit is $-55°$ C. and said lowest limit is $+4.5$Vdc.

5. The improvement of claim 3 wherein said operating temperature range is ($-55°$ C., $+125°$ C.) and said operating voltage range is (4.5Vdc, 5.5Vdc).

6. The improvement of claim 1 wherein said circuit further has an input emitter follower connected to a gating level for receiving and adjusting an input signal, the improvement further comprising an input follower current source including a third resistor and a third current source transistor having a collector connected to said input emitter follower, an emitter connected through said third resistor to said second node, and a base, and wherein said voltage regulating means is further connected to said third current source transistor base.

* * * * *